(12) United States Patent
Zhang

(10) Patent No.: US 11,329,069 B2
(45) Date of Patent: May 10, 2022

(54) DISPLAY PANEL

(71) Applicant: Shenzhen China Star Optoelectronics Semiconductor Display Technology Co., Ltd., Shenzhen (CN)

(72) Inventor: Yihe Zhang, Shenzhen (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 381 days.

(21) Appl. No.: 16/627,295

(22) PCT Filed: Dec. 16, 2019

(86) PCT No.: PCT/CN2019/125625
§ 371 (c)(1),
(2) Date: Dec. 29, 2019

(87) PCT Pub. No.: WO2021/109227
PCT Pub. Date: Jun. 10, 2021

(65) Prior Publication Data
US 2021/0305281 A1    Sep. 30, 2021

(30) Foreign Application Priority Data
Dec. 5, 2019   (CN) .......................... 201911236029.9

(51) Int. Cl.
*H01L 27/12* (2006.01)
*G06F 1/18* (2006.01)
*H04N 9/31* (2006.01)

(52) U.S. Cl.
CPC ............ *H01L 27/124* (2013.01); *G06F 1/189* (2013.01); *H04N 9/3158* (2013.01)

(58) Field of Classification Search
CPC ............ H01L 27/124; G02F 1/134345; G02F 1/136222; G02F 1/134318
USPC ........................................................... 174/255
See application file for complete search history.

(56) References Cited

U.S. PATENT DOCUMENTS

| | | | |
|---|---|---|---|
| 6,462,800 B1 | 10/2002 | Kim et al. | |
| 9,921,433 B2 | 3/2018 | Choi | |
| 2001/0048500 A1 | 12/2001 | Lim et al. | |
| 2004/0189922 A1 | 9/2004 | Ono et al. | |
| 2012/0099055 A1* | 4/2012 | Kim ................ | B29D 11/00634 |
| | | | 359/491.01 |

(Continued)

FOREIGN PATENT DOCUMENTS

| | | |
|---|---|---|
| CN | 103676374 | 3/2014 |
| CN | 106773432 | 5/2017 |

(Continued)

*Primary Examiner* — Sherman Ng

(57) ABSTRACT

The present disclosure provides a display panel including a plurality of pixel units and a plurality of common electrode line. The pixel units include a color resist block, the color resist block includes a first opening, each of the common electrode lines includes a first segment and a second segment that are arranged at intervals and respectively located on opposite sides of the first opening, the first segment and the second segment are electrically connected through a first connecting line, and an orthographic projection of the first connecting line on the base substrate does not coincide with an orthographic projection of the first opening on the base substrate.

18 Claims, 3 Drawing Sheets

(56) References Cited

U.S. PATENT DOCUMENTS

| | | | | |
|---|---|---|---|---|
| 2012/0113072 A1* | 5/2012 | Oke | ................... | G09G 3/3607 |
| | | | | 345/204 |
| 2016/0195788 A1 | 7/2016 | Bae et al. | | |
| 2016/0246133 A1 | 8/2016 | Chang et al. | | |
| 2017/0153519 A1* | 6/2017 | Xu | ................... | G02F 1/136227 |
| 2018/0341159 A1* | 11/2018 | Gan | ................... | G02F 1/1343 |
| 2019/0361290 A1* | 11/2019 | Li | ................... | G02F 1/133502 |
| 2020/0241354 A1* | 7/2020 | Sun | ................... | G02F 1/133553 |

FOREIGN PATENT DOCUMENTS

| | | |
|---|---|---|
| CN | 106842684 | 6/2017 |
| CN | 107479287 | 12/2017 |
| CN | 107561800 | 1/2018 |
| CN | 107844008 | 3/2018 |
| CN | 108181768 | 6/2018 |
| CN | 108732836 | 11/2018 |
| CN | 110082970 | 8/2019 |
| JP | 2001-059976 | 3/2001 |

\* cited by examiner

DISPLAY PANEL

RELATED APPLICATIONS

This application is a National Phase of PCT Patent Application No. PCT/CN2019/125625 having International filing date of Dec. 16, 2019, which claims the benefit of priority of Chinese Patent Application No. 201911236029.9 filed on Dec. 5, 2019. The contents of the above applications are all incorporated by reference as if fully set forth herein in their entirety.

FIELD AND BACKGROUND OF THE INVENTION

The present disclosure relates to the display technology field, and more particularly, to a display panel.

Array substrates generally include an array layer, a source/drain metal layer disposed on the array layer, and a pixel electrode located above the source/drain metal. In color filter on array (COA) array substrate, a color resist layer is integrated into the array substrate, and the color resist layer is located between the pixel electrode and the source/drain metal layer.

Traditional liquid crystal display panels require a black matrix (BM) on a side of a color film substrate for shading. When it is applied in curved liquid crystal display panels, bending the panel will shift the position of the BM and cause light leakage and color shift. In order to solve the problem, data BM less (DBS) technology is used in the COA array substrate to replace the black matrix, that is, a DBS common electrode on the same layer as the pixel electrode is disposed directly above data lines, and the DBS common electrode is used for shading above the data lines.

However, the pixel electrode needs to be electrically connected to the source/drain metal layer, thus, it is necessary to bore holes in the color resist layer. When pixel density is high, the holes in the color resist layer are close to a pixel boundary, and the topography at the holes in the color resist layer varies greatly. During the preparation of the DBS common electrode and the pixel electrode patterned, a photoresist is accumulated in the holes, resulting in increased exposure difficulty, further causing the DBS common electrode and the pixel electrode to easily remain at the boundary. Therefore, it is easy to cause the DBS electrode located at the pixel boundary to be short-circuited to the pixel electrode, causing poor display.

SUMMARY OF THE INVENTION

The present disclosure provides a display panel to solve the technical problem that the DBS common electrode and the pixel electrode easily remain at the boundary, which causes the DBS electrode located at the pixel boundary to be short-circuited to the pixel electrode, causing poor display.

In a first aspect, the present disclosure provides a display panel. The display panel comprises a base substrate, a plurality of pixel units distributed on the base substrate in an array, wherein the pixel units comprise a color resist block disposed on the base substrate and a pixel electrode disposed on the color resist block, a plurality of common electrode lines disposed on the base substrate in a longitudinal direction, wherein the common electrode lines are arranged at intervals and are located at a boundary of the pixel unit, and one of the common electrode lines corresponds to one of the pixel units.

Wherein a first opening is disposed on the color resist block near the common electrode lines, each of the common electrode lines comprises a first segment and a second segment that are arranged at intervals and respectively located on opposite sides of the first opening, each of the first segment and the second segment of the common electrode lines are electrically connected through a first connecting line, and an orthographic projection of the first connecting line on the base substrate does not coincide with an orthographic projection of the first opening on the base substrate. The first connecting line is located on sides of the first opening. An overall shape of the first connecting line is a curve or a polyline.

In other embodiments, each of the pixel units comprises a main-region, a sub-region, and a wiring region located between the main-region and the sub-region, and the first connecting line is located in the wiring region.

In other embodiments, in each column of the common electrode lines, two adjacent common electrode lines are electrically connected through a second connecting line, and an orthographic projection of the second connecting line on the base substrate does not coincide with the orthographic projection of the first opening on the base substrate.

In other embodiments, the first connecting line is electrically connected to the second connecting line.

In other embodiments, the second connecting line is located in the wiring region.

In other embodiments, the color resist block comprises a second opening located in the wiring region, and the orthographic projection of the first connecting line and the second connecting line on the base substrate does not coincide with an orthographic projection of the second opening on the base substrate.

In other embodiments, the common electrode lines, the first connecting line, the second connecting line, and the pixel electrode are disposed on a same layer.

In other embodiments, the pixel electrode comprises a main-pixel electrode located in the main-region and a sub-pixel electrode located in the sub-region.

In a second aspect, the present disclosure further provides a display panel. The display panel comprises a base substrate, a plurality of pixel units distributed on the base substrate in an array, wherein the pixel units comprise a color resist block disposed on the base substrate and a pixel electrode disposed on the color resist block, a plurality of common electrode lines disposed on the base substrate in a longitudinal direction, wherein the common electrode lines are arranged at intervals and are located at a boundary of the pixel unit, and one of the common electrode lines corresponds to one of the pixel units.

Wherein a first opening is disposed on the color resist block near the common electrode lines, each of the common electrode lines comprises a first segment and a second segment that are arranged at intervals and respectively located on opposite sides of the first opening, each of the first segment and the second segment of the common electrode lines are electrically connected through a first connecting line, and an orthographic projection of the first connecting line on the base substrate does not coincide with an orthographic projection of the first opening on the base substrate.

In other embodiments, each of the pixel units comprises a main-region, a sub-region, and a wiring region located between the main-region and the sub-region, and the first connecting line is located in the wiring region.

In other embodiments, in each column of the common electrode lines, two adjacent common electrode lines are electrically connected through a second connecting line, and an orthographic projection of the second connecting line on the base substrate does not coincide with the orthographic projection of the first opening on the base substrate.

In other embodiments, the first connecting line is electrically connected to the second connecting line.

In other embodiments, the second connecting line is located in the wiring region.

In other embodiments, the color resist block comprises a second opening located in the wiring region, and the orthographic projection of the first connecting line and the second connecting line on the base substrate does not coincide with an orthographic projection of the second opening on the base substrate.

In other embodiments, the common electrode lines, the first connecting line, the second connecting line, and the pixel electrode are disposed on a same layer.

In other embodiments, the pixel electrode comprises a main-pixel electrode located in the main-region and a sub-pixel electrode located in the sub-region.

In other embodiments, the first connecting line is located on sides of the first opening.

In other embodiments, an overall shape of the first connecting line is a curve or a polyline.

Common electrode lines are designed as a disconnected first segment and a second segment, so that a wiring of the common electrode lines does not need to pass through a first opening in a color resist block, which prevents the common electrode lines from the first opening. The first segment is electrically connected to the second segment through a first connecting line without overlapping with the first opening, thereby ensuring that the common electrode lines can work normally. Meanwhile, there is only a pixel electrode in the first opening, and the common electrode lines and the pixel electrode will not be short-circuited due to pattern residue.

Figure 1:
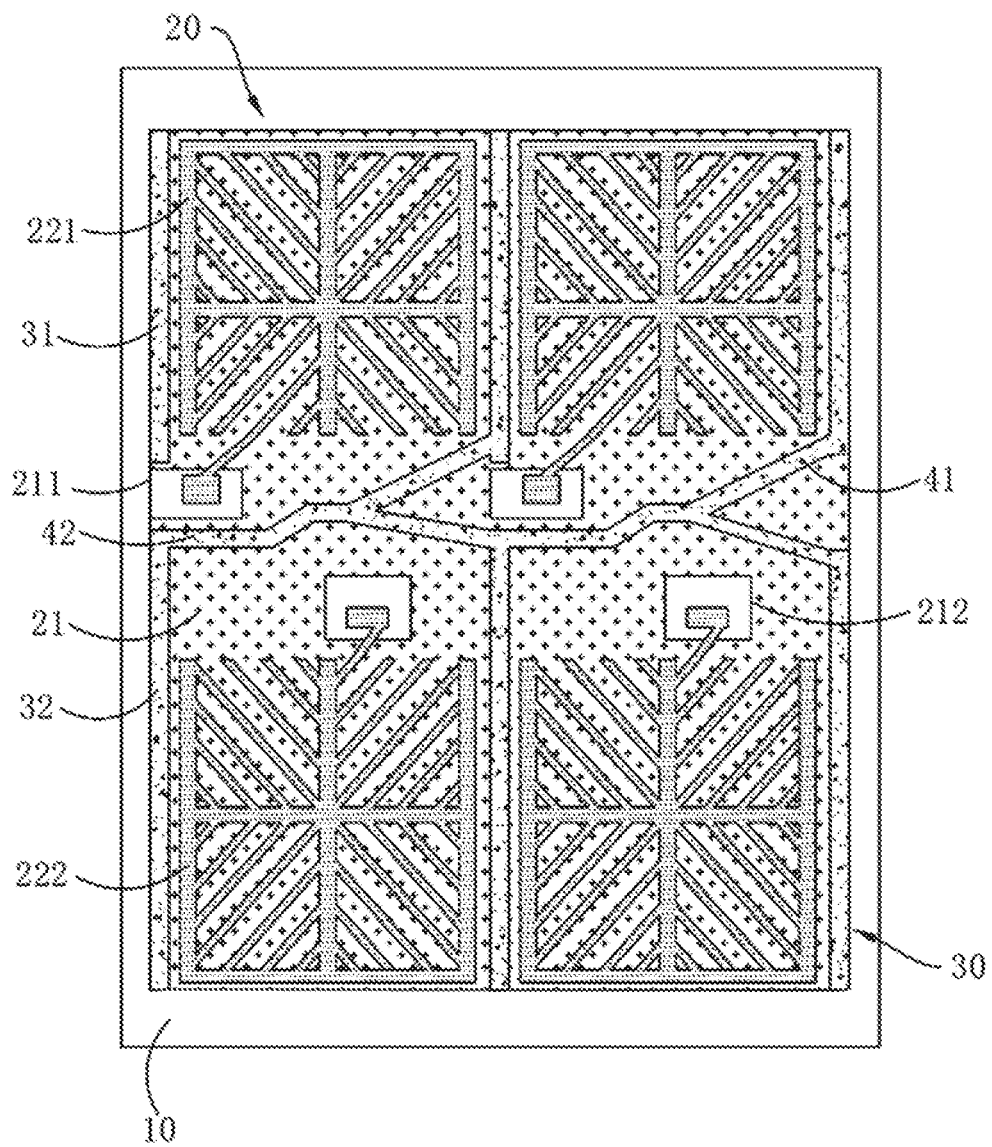
FIG. 1 is a schematic plane structure diagram of a display panel in an embodiment of the present disclosure.

Figure numerals: base substrate 10, pixel unit 20, color resist block 21, first opening 211, second opening 212, pixel electrode 22, main-pixel electrode 221, sub-pixel electrode 222, main-region 23, sub-region 24, wiring region 25, common electrode line 30, first segment 31, second segment 32, first connecting line 41, second connecting line 42, active layer 51, gate insulating layer 52, first metal layer 53, interlayer insulating layer 54, source/drain 551, data line 552, passivation layer 56.

DESCRIPTION OF SPECIFIC EMBODIMENTS OF THE INVENTION

The present disclosure provides a display panel, in order to make the purpose, technical solution, and effect of the present disclosure clearer and more definite, the following further describes the present disclosure in detail with reference to the drawings and examples. It should be understood that the specific embodiments described herein are only used to explain the present disclosure, and are not used to limit the present disclosure.

The present disclosure is directed to current array substrates, the DBS common electrode and the pixel electrode are easily to remain at the boundary, and the DBS electrode located at the pixel boundary is easily short-circuited to the pixel electrode, causing a technical problem of poor display. The present disclosure may solve the above problem.

Figure 2:
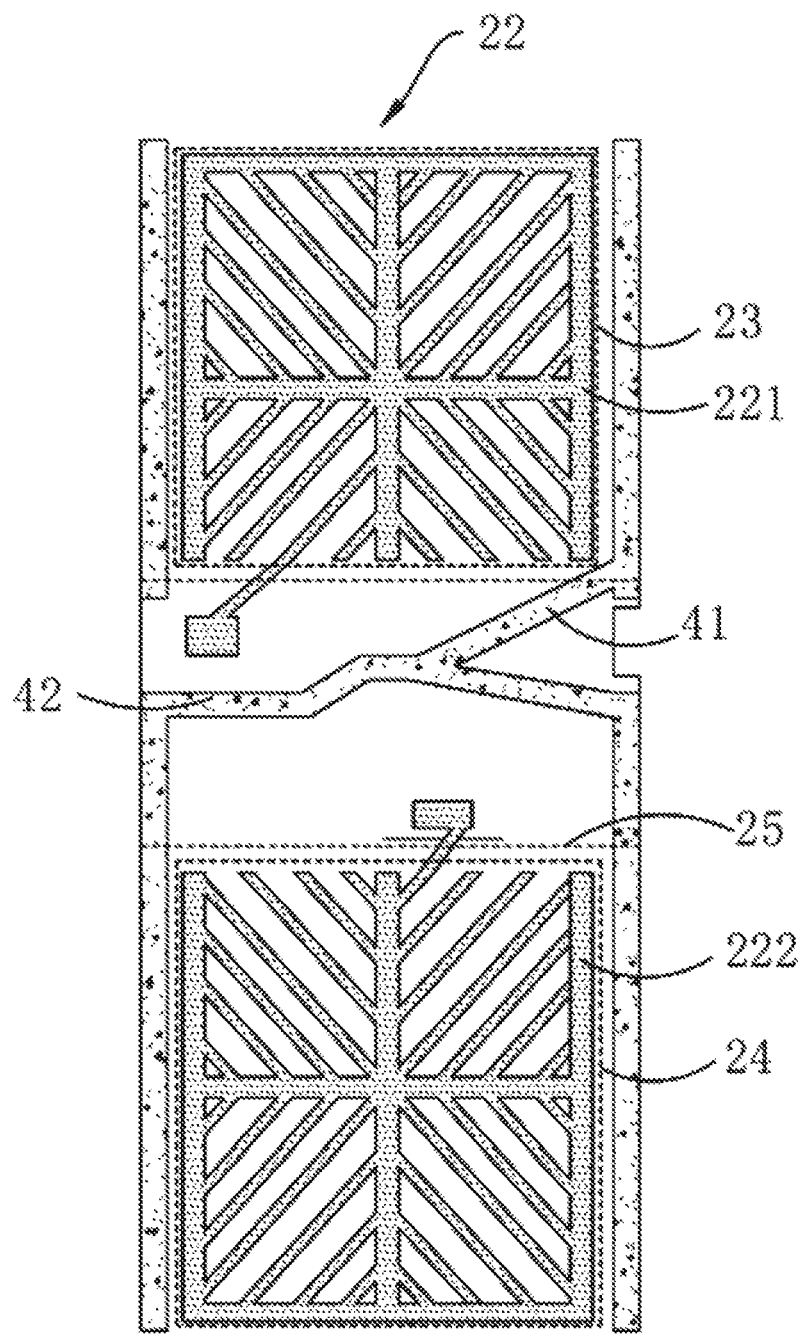
FIG. 2 is a schematic portion structure diagram of the display panel in the embodiment of the present disclosure.

A display panel as shown in FIG. 1 and FIG. 2. In one embodiment, the display panel comprises a base substrate 10, a plurality of pixel units 20 distributed on the base substrate 10 in an array, and a plurality of common electrode lines 30 disposed on the base substrate 10 in a longitudinal direction.

Specifically, the pixel units 20 comprise a color resist block 21 disposed on the base substrate 10 and a pixel electrode 22 disposed on the color resist block 21.

Specifically, the common electrode lines 30 are arranged at intervals and are located at a boundary of the pixel unit 20, and one of the common electrode lines 30 corresponds to one of the pixel units 20.

Specifically, a first opening 21 is disposed on the color resist block 21 near the common electrode lines 30, each of the common electrode lines 30 comprises a first segment 31 and a second segment 32 that are arranged at intervals and respectively located on opposite sides of the first opening 211, each of the first segment 31 and the second segment 32 of the common electrode lines 30 are electrically connected through a first connecting line 41, and an orthographic projection of the first connecting line 41 on the base substrate 10 does not coincide with an orthographic projection of the first opening 211 on the base substrate 10.

The common electrode lines 30 are designed as a disconnected first segment 31 and a second segment 32, so that a wiring of the common electrode lines 30 does not need to pass through a first opening 211 in a color resist block 21, which prevents the common electrode lines 30 from the first opening 211. The first segment 31 is electrically connected to the second segment 32 through a first connecting line 41 without overlapping with the first opening 211, thereby ensuring that the common electrode lines 30 can work normally. Meanwhile, there is only the pixel electrode 22 in the first opening 211, and the common electrode lines 30 and the pixel electrode 22 will not be short-circuited due to pattern residue.

Specifically, each of the pixel units 20 comprises a main-region 23, a sub-region 24, and a wiring region 25 located between the main-region 23 and the sub-region 24, and the first connecting line 41 is located in the wiring region 25.

Wherein the pixel electrode 22 comprises a main-pixel electrode 221 located in the main-region 23 and a sub-pixel electrode 222 located in the sub-region 24.

It should be noted that, the first connecting line 41 connects the first segment 31 and the second segment 32 to achieve an electrical connection between the first segment 31 and the second segment 32. Meanwhile, the first connecting line 41 is located in the wiring region 25, which can prevent the first connecting line 41 from being short-circuited to the main-pixel electrode 221 or the sub-pixel electrode 222.

Further, the first connecting line 41 is located at a side of the first opening 211.

Further, an overall shape of the first connecting line 41 is a curve or a polyline, so that a region where the first opening 211 is located can be better avoided.

Specifically, in each column of the common electrode lines 30, two adjacent common electrode lines 30 are electrically connected through a second connecting line 42, and an orthographic projection of the second connecting line 42 on the base substrate 10 does not coincide with the orthographic projection of the first opening 211 on the base substrate 10.

The second connection line 42 is used to electrically connect two adjacent common electrode lines 30, and the second connection line 42 is also not overlapped with the first opening 211, which prevent the second connection line 42 and the pixel electrode 22 from being short-circuited.

In one embodiment, the common electrode line 30 is disposed at a left boundary and a right boundary of each of the pixel units 20.

It should be noted that, in each row of the common electrode lines 30, two adjacent common electrode lines 30 are electrically connected.

Specifically, the first connecting line 41 is electrically connected to the second connecting line 42, and the second connecting line 42 is located in the wiring region 25.

Specifically, the color resist block 21 comprises a second opening 212 located in the wiring region 25, and the orthographic projection of the first connecting line 41 and the second connecting line 42 on the base substrate 10 does not coincide with an orthographic projection of the second opening 212 on the base substrate 10.

It should be noted that, the first opening 211 is also located in the wiring region 25. The main-pixel electrode 221 is connected to lower metal layers through the first opening 211, and the sub-pixel electrode 222 is connected to lower metal layers through the second opening 212.

Specifically, the common electrode lines 30, the first connecting line 41, the second connecting line 42, and the pixel electrode 22 are disposed on a same layer.

Wherein the common electrode lines 30, the first connecting line 41, the second connecting line 42, and the pixel electrode 22 may be made of same material and formed through a same process.

Figure 3:
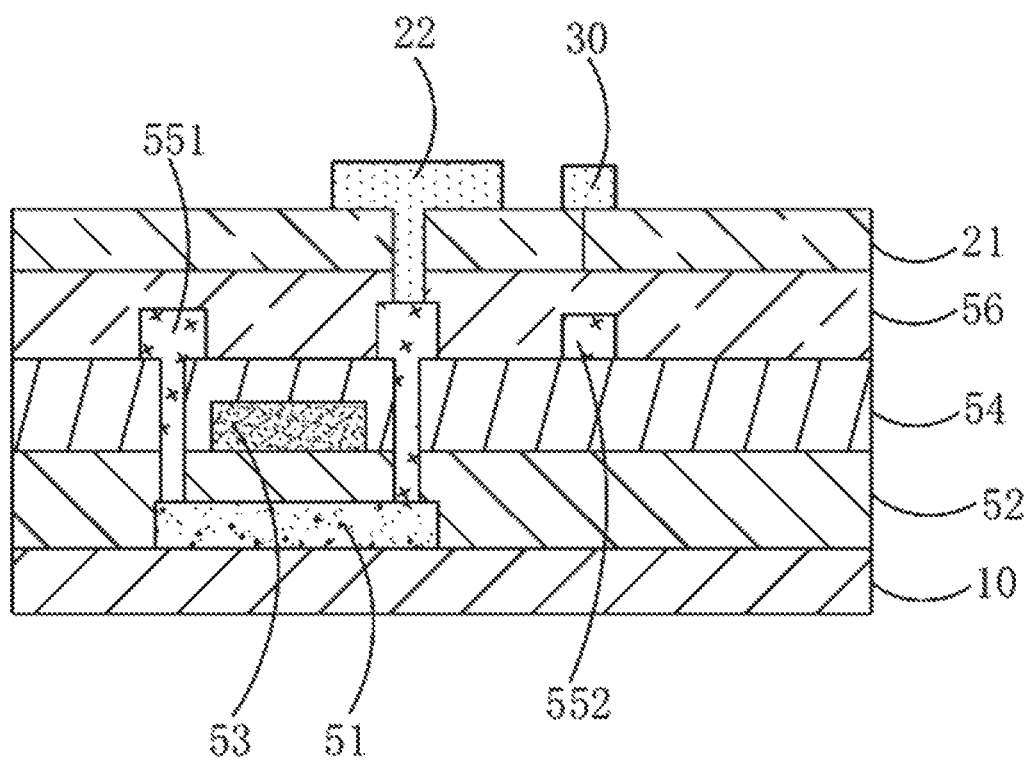
FIG. 3 is a schematic cross-sectional diagram of the display panel in the embodiment of the present disclosure.

As shown in FIG. 3, in one embodiment, the display panel further comprises an active layer 51 disposed on the base substrate 10, a gate insulating layer 52 covering the active layer 51, a first metal layer 53 disposed on the gate insulating layer 52, an interlayer insulating layer 54 covering the first metal layer 53, a second metal layer disposed on the gate insulating layer 52, and a passivation layer 56 covering the second metal layer.

Wherein the color resist block 21 is disposed on the passivation layer 56, and the second metal layer comprises a source/drain electrode 551 and a data line 552. The common electrode line 30 is located directly above the data line 552 and is disposed in parallel with the data line 552, which prevents light leakage from occurring at the data line 552.

Advantageous effects of the present disclosure are that, the common electrode lines 30 are designed as the disconnected first segment 31 and the second segment 32, so that a wiring of the common electrode lines 30 does not need to pass through the first opening 211 in the color resist block 21, which prevents the common electrode lines 30 from the first opening 211. The first segment 31 is electrically connected to the second segment 32 through a first connecting line 41 without overlapping with the first opening 211, thereby ensuring that the common electrode lines 30 can work normally. Meanwhile, there is only the pixel electrode 22 in the first opening 211, and the common electrode lines 30 and the pixel electrode 22 will not be short-circuited due to pattern residue.

It should be noted that, for those of ordinary skill in the art, various other corresponding changes and modifications can be made according to the technical solutions and technical concepts of the present disclosure, and all these changes and modifications should belong to the protection scope of the claims attached to the present disclosure.

What is claimed is:

1. A display panel, comprising:
a base substrate;
a plurality of pixel units distributed on the base substrate in an array, wherein the pixel units comprise a color resist block disposed on the base substrate and a pixel electrode disposed on the color resist block; and
a plurality of common electrode lines disposed on the base substrate in a longitudinal direction, wherein the common electrode lines are arranged at intervals and are located at a boundary of the pixel unit, and one of the common electrode lines corresponds to one of the pixel units;
wherein a first opening is disposed on the color resist block near the common electrode lines, each of the common electrode lines comprises a first segment and a second segment that are arranged at intervals and respectively located on opposite sides of the first opening, each of the first segment and the second segment of the common electrode lines are electrically connected through a first connecting line, and an orthographic projection of the first connecting line on the base substrate does not coincide with an orthographic projection of the first opening on the base substrate;
the first connecting line is located on sides of the first opening; and
an overall shape of the first connecting line is a curve or a polyline.

2. The display panel as claimed in claim 1, wherein each of the pixel units comprises a main-region, a sub-region, and a wiring region located between the main-region and the sub-region, and the first connecting line is located in the wiring region.

3. The display panel as claimed in claim 2, wherein in each column of the common electrode lines, two adjacent common electrode lines are electrically connected through a second connecting line, and an orthographic projection of the second connecting line on the base substrate does not coincide with the orthographic projection of the first opening on the base substrate.

4. The display panel as claimed in claim 3, wherein the first connecting line is electrically connected to the second connecting line.

5. The display panel as claimed in claim 3, wherein the second connecting line is located in the wiring region.

6. The display panel as claimed in claim 5, wherein the color resist block comprises a second opening located in the wiring region, and the orthographic projection of the first connecting line and the second connecting line on the base substrate does not coincide with an orthographic projection of the second opening on the base substrate.

7. The display panel as claimed in claim 3, wherein the common electrode lines, the first connecting line, the second connecting line, and the pixel electrode are disposed on a same layer.

8. The display panel as claimed in claim 2, wherein the pixel electrode comprises a main-pixel electrode located in the main-region and a sub-pixel electrode located in the sub-region.

9. A display panel, comprising:
a base substrate;
a plurality of pixel units distributed on the base substrate in an array, wherein the pixel units comprise a color resist block disposed on the base substrate and a pixel electrode disposed on the color resist block; and a plurality of common electrode lines disposed on the base substrate in a longitudinal direction, wherein the common electrode lines are arranged at intervals and are located at a boundary of the pixel unit, and one of the common electrode lines corresponds to one of the pixel units;

wherein a first opening is disposed on the color resist block near the common electrode lines, each of the common electrode lines comprises a first segment and a second segment that are arranged at intervals and respectively located on opposite sides of the first opening, each of the first segment and the second segment of the common electrode lines are electrically connected through a first connecting line, and an orthographic projection of the first connecting line on the base substrate does not coincide with an orthographic projection of the first opening on the base substrate.

10. The display panel as claimed in claim 9, wherein each of the pixel units comprises a main-region, a sub-region, and a wiring region located between the main-region and the sub-region, and the first connecting line is located in the wiring region.

11. The display panel as claimed in claim 10, wherein in each column of the common electrode lines, two adjacent common electrode lines are electrically connected through a second connecting line, and an orthographic projection of the second connecting line on the base substrate does not coincide with the orthographic projection of the first opening on the base substrate.

12. The display panel as claimed in claim 11, wherein the first connecting line is electrically connected to the second connecting line.

13. The display panel as claimed in claim 11, wherein the second connecting line is located in the wiring region.

14. The display panel as claimed in claim 13, wherein the color resist block comprises a second opening located in the wiring region, and the orthographic projection of the first connecting line and the second connecting line on the base substrate does not coincide with an orthographic projection of the second opening on the base substrate.

15. The display panel as claimed in claim 11, wherein the common electrode lines, the first connecting line, the second connecting line, and the pixel electrode are disposed on a same layer.

16. The display panel as claimed in claim 10, wherein the pixel electrode comprises a main-pixel electrode located in the main-region and a sub-pixel electrode located in the sub-region.

17. The display panel as claimed in claim 9, wherein the first connecting line is located on sides of the first opening.

18. The display panel as claimed in claim 9, wherein an overall shape of the first connecting line is a curve or a polyline.

* * * * *